United States Patent [19]

Hacskaylo

[11] 4,264,406
[45] Apr. 28, 1981

[54] METHOD FOR GROWING CRYSTALS

[75] Inventor: Michael Hacskaylo, Falls Church, Va.

[73] Assignee: The United States of America as represented by the Secretary of the Army, Washington, D.C.

[21] Appl. No.: 47,429

[22] Filed: Jun. 11, 1979

[51] Int. Cl.³ ............................................. C30B 11/02
[52] U.S. Cl. ........................ 156/616 R; 156/DIG. 72; 422/248
[58] Field of Search .................... 156/DIG. 72, 616 R, 156/616 A; 422/248

[56] References Cited

U.S. PATENT DOCUMENTS

| | | | |
|---|---|---|---|
| 3,591,340 | 7/1971 | Plaskett | 422/248 |
| 3,607,137 | 9/1971 | Inoguchi | 156/616 R |
| 3,898,051 | 8/1975 | Schmid | 422/248 |
| 4,141,777 | 2/1979 | Matveev et al. | 156/616 R |
| 4,190,486 | 2/1980 | Kyle | 156/616 R |

OTHER PUBLICATIONS

Kyle; "Growth of Semi-Insulating Cadmium Telluride;" Nov. 1971, from J. of the Electrochemical Society; vol. 118, #11.

Jensen et al., "A Sealed Crucible for Growth of Metal Crystals" Rev. of Scientific Instruments, Oct. 1971, vol. 42, #10.

Cawson et al., "Preparation of Single Crystals" pp. 13–19; Jun. 1958; Butterworths Scientific Publications; London.

Primary Examiner—Tim R. Miles
Assistant Examiner—Gregory N. Clements
Attorney, Agent, or Firm—Nathan Edelberg; Robert P. Gibson; John E. Holford

[57] ABSTRACT

A method is provided to liquify and then freeze a crystallizable stoichiometric compound so that a large well defined interface between simultaneous liquid and solid phases moves at a preprogrammed rate through the compound without moving the compound or the vessel in which it is contained.

5 Claims, 1 Drawing Figure

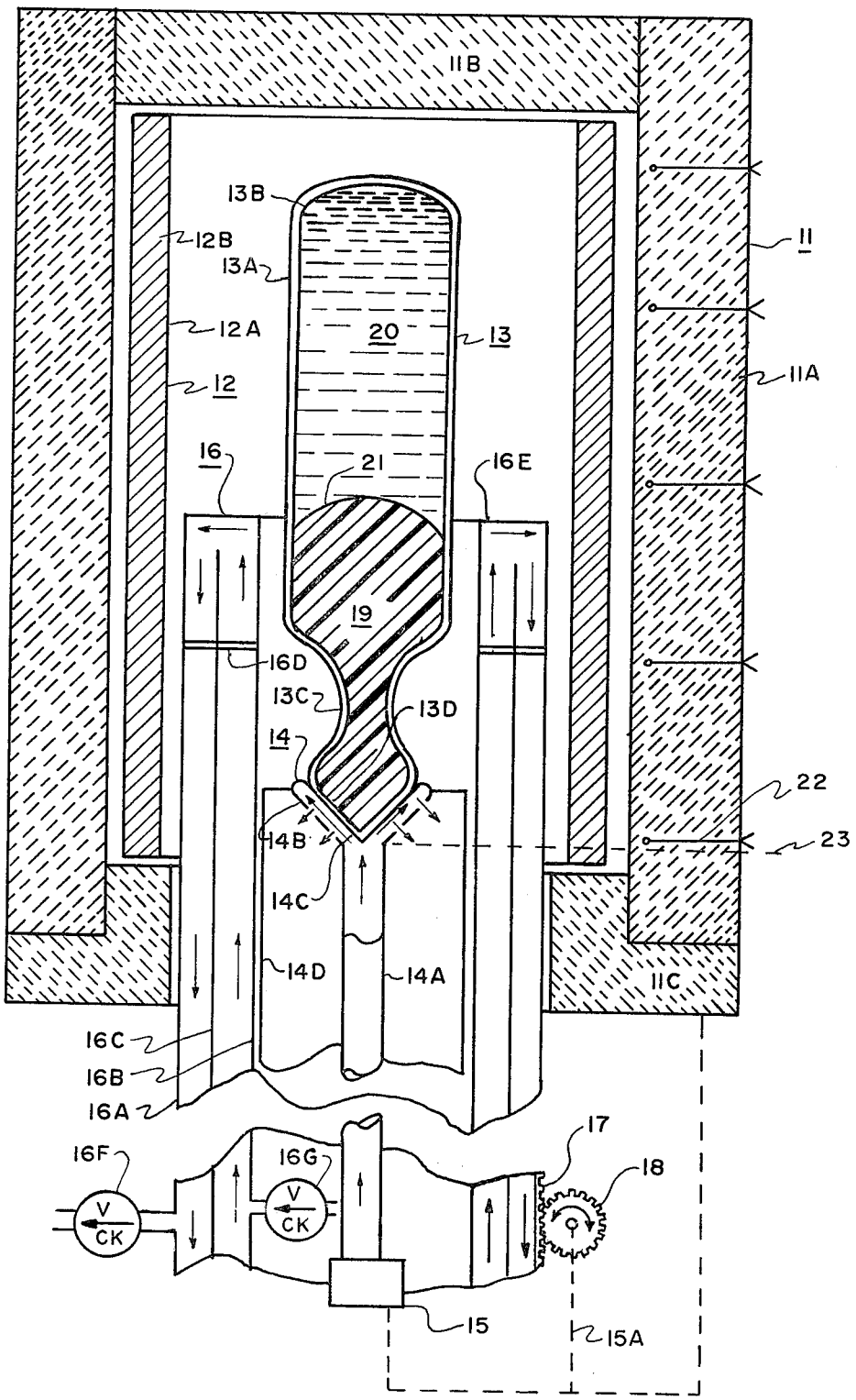

METHOD FOR GROWING CRYSTALS

The invention described herein may be manufactured, used, and licensed by the U.S. Government for governmental purposes without the payment of any royalties thereon.

BACKGROUND OF THE INVENTION

The art of crystal growing as it relates to electronic semiconductors and the like has placed a special emphasis on the growth of large substantially perfect crystals. The size of the crystal determines the size of the electronic circuits that can be made from it. One case in point involves optical detector arrays. The larger the array the better can be the resolution of a given image projected thereon. Large single crystals also are valuable for tools, standards and for their aesthetic qualities, and the present application is directed to all of these areas.

One type of crystal that appears to be particularly promising, at least in the field of optical detectors is cadmium telluride (CDTe). The apparati and methods used to date for the growth of CdTe have not been successful in producing large sized, i.e. greater than about 2 cm diameter single crystals of high purity and stoichiometry. The growth habits of CdTe are best described as being inconsistent. A boule or continously grown body of CdTe will exhibit precipitates, lattice defects, multiple crystal growth, and twinning. Four prior art methods and their advantages with regard to CdTe crystals are listed below.

a. The Czochralski method; J. Czochralski, Z. Physik. Chem 92, 219 (1917), J. B. Mullin and B. W. Straughan, Revue de Physique Applique, 12, 105 (1977); is the growth of CdTe on a CdTe seed crystal which is partially immersed in the CdTe melt. The seed is rotated in order to facilitate solution stirring and is slowly drawn upwards from the melt as the crystal is grown. In order to eliminate or minimize the vapor losses of CdTe at temperatures of about 1100° C., the crystal is grown in a high pressure chamber or the melt is encapsulated with $B_2O_3$, a material that exhibits very low vapor pressure. CdTe that is grown by this method exhibits poor crystalline qualitites, i.e. excessive low angle grain boundaries, lamellar twins, dislocations and precipitates.

b. The vertical Bridgman technique; N. R. Kyle, J. Electrochem. Soc. 118, 1790 (1971); is the planar solidification of a material from the molten state. Stoichiometrically prepared CdTe is sealed in a two-inch diameter fused silica crucible and heated to approximately 1120° C. The crucible is lowered at about 0.5 cm per hour through a solidification zone of about 1090° C. A 10 cm (in length) boule of CdTe can be grown in approximately 24 hours. The boule consists of large domains of single crystals, twin planes, inclusions, and microcrystalline material. A boule will normally yield $1 \times 1 \times 2$ cm crystals.

c. The traveling heater method; S. Brelant, M. Elliott, G. Entine and S. Hsu, Rev. Phys. Appl. 12, 141 (1977); is a narrow zone dissolution-regrowth technique. A one-cm diameter CdTe rod is sealed in a fused silica ampoule containing a prescribed amount of Te at the bottom. The tube is slowly lowered through a 0.5–1.0 cm wide resistance zone heater which is at about 700° C. As the rod slowly moves downward through the hot zone the upper surface of molten Te dissolves CdTe, and the lower surface, being cooled by ambient, the CdTe regrows in crystalline form. The rod is lowered at a rate of approximately 5 mm per day. The travel rate is limited primarily by the diffusion time of the dissolved CdTe in the molten zone for recrystallization. The boundaries and crystal size is limited in diameter, i.e. 1 cm and is not free of grain boundaries and precipitates.

d. The solution growth method; K. Zano, J. Electron. Matl. 3, 327 (1974); is the crystallization and growth of CdTe in a Te-rich solution. The material is sealed in a 2-inch flat-bottomed quartz crucible and heated to 900° C. A "cold finger" is applied to the center of the bottom of the crucible and thus becomes the site for nucleation. The thermal gradients induced by the cold finger enables the liquid to circulate over the growth site. As the CdTe grows the solution becomes more Te-rich and thus is cooled at a rate of about 4° C. per hour to a temperature of 650° C. The crystal is grown in a "cake" form at the bottom with the (110) plane perpendicular to the base of the crucible. The cake still exhibits the undesirable properties described in methods a, b, and c, but due to the circulation of the solution and lower growth temperatures, the crystals exhibit smaller volumes of precipitates and lesser numbers of grain boundaries and twin planes than the other methods. A crystal can be grown in about two days.

BRIEF DESCRIPTION OF THE INVENTION

It is an object of the present invention to provide an improved method of growing single crystals and the like using only stoctrometric quantities of one or more elemental crystal materials. It is a further object to grow the crystal in a crucible from a liquid phase under highly controlled conditions without moving the elemental material or the crucible. It is a further object of the invention to provide an improved apparatus employing a moveable cooled shroud in cooperation with a fixed cooled pedestal to control the temperature of the crucible and its contents in the crystal growing oven.

BRIEF DESCRIPTION OF THE DRAWINGS

The invention is best understood with reference to the accompanying drawings wherein the FIGURE shows an oven containing a fixed cooled pedestal, a cooled moving shroud and a crucible containing elemental crystal material in two phases near the middle of the crystal growth cycle.

DESCRIPTION OF THE INVENTION

As shown in the drawing FIGURE the furnace 11 in which the boule is grown consists mainly of a ceramic sidewall 11A in the form of a vertical hollow tube, the cross-section of which may correspond to the cross-section of the crystal, both of which are preferably circular to simplify the furnace structure. The top end of the furnace is closed with a ceramic end plug 11B presenting a flat inner surface normal to the axis of the sidewall. The bottom end is partially closed by a similar apertured plug 11C. A uniform hollow cylindrical or tubular heat pipe 12 may be inserted in the furnace and held in place by the end plugs. The latter consists essentially of a stainless steel jacket 12A filled with a excellent conductor 12B which is in vapor form at the operating temperature of the furnace, such as sodium or mercury. This arrangement insures a uniform radial radiation of heat toward the center axis of furnace when the crosssections of the heat pipe elements are annular and concentric with that axis.

The reaction vessel 13 in which the boule is to be formed is also preferably circular in cross-section and stands coaxially in the furnace. It consists of a tubular quartz crucible 13A with a graphite inner lining 13B. It extends axially slightly less than the axial inner length of the furnace. Near the bottom, the crucible has a necked-down portion 13C followed by a flared out region and a conical base portion 13D.

The crucible is supported by its base portion which intimately contacts a pedestal 14. The pedistal consists mainly of a coolant tube 14A formed of a good heat conductor which is capable of withstanding the operating temperature in the furnace, such as stainless steel. The upper end of this tube is flared and perforated to provide a first apertured cone shaped wall. A second nonapertured cone shaped wall about the same size as the first is shaped to match the base of the crucible and is located coaxial with and uniformerly spaced above the first. The two are joined at their largest diameter by a toroidal wall which projects only a short distance axially (if at all) and is also without apertures. A tubular pedestal shroud 14D coaxially surrounds the coolant tube and is also sealed to the large diameter end of the apertured conical wall. The pedestal shroud which preferably is also generally circular in cross-section has a much greater inner cross-section than the outer cross-section of the cooling tube 14A and extends through the apertured end plug 11C, so that a coolant (indicated by vectors) entering through the former can expand and pass out of the furnace without distrubing the flat heat profile established in the furnace by the heat pipe and end walls. If the coolant is to be recovered the pedestal shroud may be closed at the bottom by an annular wall between this shroud and the coolant tube and couplings like 16F and 16G (to be described) may be used in combination therewith. A mounting structure 15 attached to the outside of the furnace by a frame structure indicated by dashed line structure 15A maintains the pedestal and reaction vessel in a fixed position during formation of the boule. The mounting structure may include a simple slip type tube coupling to permit easy removal of the pedestal and/or a movable support structure coupled to an external coolant supply with flexible hoses or the like may be provided according to principles well known in the art. The preferred coolant is air supplied by an external fan or blower.

To control crystal growth a moveable crucible shroud 16 is provided. The shroud consists essentially of three concentric shroud tubes 16A, 16B and 16C; again preferably circular in cross-section. The outer and inner crucible shroud walls defined by tubes 16A and 16C, respectively, are joined by an annular end wall 16E at a first end that projects into the furnace in coaxial relationship to the pedestal and crucible. Tube 16B constitutes a partition wall that terminates a distance from the end wall 16E about equal to its spacing from tubes 16A and 16C. This spacing may be roughly equal to the diameter of the pedestal coolant tube. This partition wall is suspended by spacers 16D which join the three tubes and preferably are post-like to present a small cross-section as compared with a normal cross-section between two adjacent tubes. The bottom end of the shroud resembles the top except that the partition wall is also sealed to the end wall and input or output couplings 16F and 16G are provided in the end wall or nearby side wall. These couplings may include check valves, if back flow of heated coolant is a problem or special coolants are desired. Both shroud structures 14 and 16 may be coupled in like fashion to the same supply.

The crucible shroud is driven axially by a rack 17 attached to the shroud and a pinion journaled to the furnace. Any tendency for this shroud to rotate about any axis except the concentric one may be avoided by keeping a close fit between it and the pedestal shroud. The shroud is spaced from the furnace walls, the heat pipe and the crucible. External bearing surfaces for the crucible shroud may also be used if desired, to achieve only axial movement.

Using the above apparatus a boule is obtained from a liquid solution of two or more elemental substance by the following steps;

a. Stochiometric quantities of the elemental substances of which the boule is to be made are sealed into the crucible, either in their pure status or as alloys of the pure materials;

b. The crucible is next mounted on the conical pedestal and the latter mounted in its normal fixed position in the furnace;

c. The temperature of the furnace is then raised above the melting point of the substance 20, e.g. tellurium, which serves as a solute until the solvent 19, e.g. cadmium, completely dissolves therein leaving no liquid solid interface 21 (for CdTe this involves a temperature of about 1105° C. for several hours); the furnace temperature is controlled to within ±1° C. by thermocouples 22 embedded in the furnace wall which in turn operate electric heaters and the like (not shown) in the usual manner well known in the art;

d. The crucible shroud is next raised to the level 23 just below the conical end of the crucible;

e. A fluid coolant is then pumped into the coolant tube of the pedestal and between the innermost walls of the crucible shroud producing a maximum cooling effect, which by virtue of the necked down section 13C, is directed to the center of the crucible;

f. As the crystal growth begins to progress more rapidly through the necked-down portion of the crucible, the crucible shroud is raised to keep pace with the liquid-solid interface 21 where it meets the wall, the interface assumes a convex shape as it emerges from the necked portion, the specific shape of which is a function of the relative position and rate of coolant flow in the two shroud structures;

g. When the boule is fully formed, i.e. when it is completely covered by the crucible shroud (about 24 hours for CdTe) the furnace heaters are shut down;

h. As soon as the furnace temperature falls below the melting point of the solute, the crucible shroud is completely retracted from the furnace and the pedestal and crucible removed;

i. When the crucible reaches room temperature the crucible is carefully broken and removed to expose the boule.

The best growth rate for most solutions are known, but current methods still yield boules with individual crystals of moderate size however are too small for large size electro-optical devices. By applying this method to grow crystals from the melt, the problem of growing large single crystals without microcrystalline structure and twin planes is solved.

It will be obvious to those skilled in the art to apply many well known teachings to the method and structures described above. For example, it is obvious that heating, cooling and mechanical movements described can be controlled by a computer to maximize the crystal quality and minimize the cost and time of growing large crystals. The invention, however, is to be limited only the claims which follow.

I claim:

1. In the method of growing single crystals including the steps of sealing a stochiometric mixture of crystal material in a crucible necked down at one end, placing said crucible near a furnace wall, heating said wall and at least a major portion of said crucible and said material above the melting point of said material and progressively cooling said material below said melting point from said one end of said crucible to its opposite end; the improvement comprising the steps of:

maintaining said crucible and said wall in fixed relationship to one another during said heating and cooling steps;

maintaining said wall temperature above said melting point during said cooling steps; and progressively inserting a shroud between and spaced from said crucible and said wall during said material cooling step.

2. The method according to claim 1 further including the step of: cooling said shroud during said material cooling step.

3. The method according to claim 2 wherein said step of cooling said crucible further includes:

passing a cooling gas through said shroud.

4. The method according to claim 1 further including the steps of:

conductively cooling only said one end of said crucible after heating said wall and prior to inserting said shroud.

5. The method according to claims 2, 3, or 4 wherein the step of inserting said shroud includes:

inserting a first portion of said shroud between the said wall and said one end; and progressively inserting additional portions of said shroud until said crucible is completely shielded thereby from direct radiation emitted by said furnace wall.

* * * * *